(12) United States Patent
Fitzsimmons et al.

(10) Patent No.: US 7,780,060 B2
(45) Date of Patent: Aug. 24, 2010

(54) METHODS AND APPARATUS FOR EFFICIENTLY GENERATING PROFILES FOR CIRCUIT BOARD WORK/REWORK

(75) Inventors: Henry E. Fitzsimmons, Rochester, NH (US); John A. Cogliandro, Dedham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/695,476

(22) Filed: Jan. 28, 2010

(65) Prior Publication Data

US 2010/0127050 A1    May 27, 2010

Related U.S. Application Data

(62) Division of application No. 11/461,551, filed on Aug. 1, 2006, now Pat. No. 7,681,776.

(51) Int. Cl.
 *B23K 31/02* (2006.01)
(52) U.S. Cl. .............. 228/102; 228/103; 228/119; 228/233.2
(58) Field of Classification Search .............. None
 See application file for complete search history.

(56) References Cited

U.S. PATENT DOCUMENTS

| | | | |
|---|---|---|---|
| 4,750,664 A * | 6/1988 | Furtek | 228/102 |
| 4,752,025 A * | 6/1988 | Stach et al. | 228/9 |
| 4,771,929 A * | 9/1988 | Bahr et al. | 228/102 |
| 4,840,305 A | 6/1989 | Ankrom et al. | |
| 4,972,990 A * | 11/1990 | Abbagnaro et al. | 228/20.1 |
| 5,058,422 A | 10/1991 | Shimauchi | |
| 5,147,083 A * | 9/1992 | Halstead et al. | 228/42 |
| 5,413,164 A | 5/1995 | Teshima et al. | |
| 5,433,368 A | 7/1995 | Spigarelli | |

(Continued)

FOREIGN PATENT DOCUMENTS

DE    3 635 448    1/1988

(Continued)

OTHER PUBLICATIONS

Notification of transmittal of the International Search Report and the Written Opinion of the International Searching Authority, or the Declaration; PCT/US2007/014638 dated May 6, 2008, 6 pages.

(Continued)

*Primary Examiner*—Kiley Stoner
(74) *Attorney, Agent, or Firm*—Daly, Crowley, Mofford & Durkee, LLP

(57) ABSTRACT

Methods and articles for receiving times and temperatures for stages of a profile including solder heating stages to rework a populated printed circuit board (PCB), the rework including removing a first integrated circuit (IC) from the PCB, focusing heat on the first integrated circuit using an oven element during rework of the PCB, collecting actual temperature information from a plurality of temperature sensing elements to detect actual temperature information associated with the first integrated circuit, and generating a suggested modification for an operator to modify the time and/or the temperature of at least one of the stages in the profile in response to a fail status indicating that the collected actual temperature information did not meet temperatures for a variable.

18 Claims, 11 Drawing Sheets

U.S. PATENT DOCUMENTS

| | | | |
|---|---|---|---|
| 5,439,160 | A | 8/1995 | Marcantonio |
| 5,553,768 | A * | 9/1996 | Lasto et al. ............... 228/102 |
| 5,562,243 | A | 10/1996 | Marcantonio |
| 5,598,965 | A * | 2/1997 | Scheu .................... 228/6.2 |
| 5,826,779 | A * | 10/1998 | Jacks et al. ............... 228/42 |
| 5,971,249 | A | 10/1999 | Berkin |
| 6,138,893 | A | 10/2000 | Caletka et al. |
| 6,168,064 | B1 * | 1/2001 | Berkin ..................... 228/9 |
| 6,227,434 | B1 * | 5/2001 | Bassi et al. .............. 228/119 |
| 6,257,478 | B1 * | 7/2001 | Straub ................... 228/6.2 |
| 6,301,436 | B1 | 10/2001 | Hsiao |
| 6,347,732 | B1 * | 2/2002 | Akin et al. .................. 228/9 |
| 6,435,401 | B1 * | 8/2002 | Miitsu et al. ............. 228/264 |
| 6,512,209 | B1 | 1/2003 | Yano |
| 6,685,080 | B1 | 2/2004 | Kee et al. |
| 6,799,712 | B1 | 10/2004 | Austen et al. |
| 6,971,571 | B2 * | 12/2005 | Nakamura et al. ....... 228/233.2 |
| 7,096,146 | B2 | 8/2006 | Satsukawa |
| 7,145,463 | B2 | 12/2006 | Olsen |
| 7,457,725 | B1 | 11/2008 | Civilini |
| 7,549,566 | B2 | 6/2009 | Nonomura et al. |
| 2001/0004990 | A1 * | 6/2001 | Cox et al. .................. 228/19 |
| 2001/0017313 | A1 * | 8/2001 | Mays et al. .............. 228/264 |
| 2004/0025336 | A1 * | 2/2004 | Patrick .................... 29/840 |
| 2004/0056068 | A1 * | 3/2004 | Rae et al. ................ 228/102 |
| 2005/0023327 | A1 * | 2/2005 | Pendse ............... 228/180.22 |
| 2005/0133574 | A1 * | 6/2005 | Glever et al. ............. 228/207 |
| 2005/0173499 | A1 * | 8/2005 | Luebs .................... 228/264 |
| 2006/0196912 | A1 * | 9/2006 | Sato ....................... 228/10 |
| 2006/0202001 | A1 * | 9/2006 | Birchall et al. ............ 228/264 |
| 2006/0221741 | A1 | 10/2006 | Jain et al. |

FOREIGN PATENT DOCUMENTS

| | | | |
|---|---|---|---|
| EP | 0 373 376 | | 6/1990 |
| JP | 02263570 A | | 10/1990 |
| JP | 2005-085708 A | * | 3/2005 |
| JP | 2005-223000 A | * | 8/2005 |

OTHER PUBLICATIONS

Written Opinion of the International Searching Authority, PCT/US2007/014638 dated May 6, 2008, 11 pages.

Notification Concerning Transmittal of International Preliminary Report on Patentability (Chapter 1 of the Patent Cooperation Treaty); PCT/US2007/014638 dated Feb. 12, 2009, 11 pages.

AIRVAC, Onyx29, Robotic SMT Rework, Repair & Low Volume Assembly, Dec. 14, 2006, pp. 1-4, www.air-vac-eng.com.

Conway et al: "Automated Adaptive Control Of The Reflow Soldering Of Electronic Assemblies" Electronics Manufacturing Technology Symposium, 1997., Twenty-First IEEE/CPMT International Austin, TX, USA Oct. 13-15, 1997, New York, NY, USA, IEEE, US, Oct. 13, 1997, pp. 229-236, XP010249732. ISBN: 0-7803-3929-0.

Naugler D: "Area Array Rework—Size Does Matter" Circuits Assembly, Miller Freeman Publications, San Francisco, CA, US, vol. 13, No. 7, Jul. 2002, pp. 36-40, XP009098729. ISSN: 1054-0407.

Arbib S J: "Forecasting The Reflow Soldering Process" Electronic Packaging And Production, Cahners Publishing Co, Newton, MA, US, vol. 39, No. 2, Feb. 1999, pp. 93-94, 96. ISSN: 0013-4945.

Manko H H: "Heat Profile Control Of Soldering And Cleaning Processes" Electronic Packaging And Production, Cahners Publishing Co, Newton, MA, US, vol. 37, No. 3, Feb. 1997, pp. 73-74, 76 & 78, XP000682354. ISSN: 0013-4945.

"Partielles Reflow-Loten" F & M. Feinwerktechnik Mikrotechnik Messtechnik, Hanser, Munchen, DE, vol. 101, No. 11/12, Nov. 1, 1993, p. 436, XP000411567. ISSN: 0944-1018.

File downloaded from PAIR for Application No. 11/461,551 filed on Aug. 1, 2006, file through Jun. 8, 2010.

* cited by examiner

Historical Import.txt

Chronological History Report for part: TEST CARD U6     ← 800
Print Date:

Export Date:
Part: U6
Profile: TEST CARD U6
Machine:

| StatName | LCL | Actual | UCL | Status |
|---|---|---|---|---|
| Bottom Time Over 183 | 0 | 67 | 0 | HIGH-FAIL |
| BottomMaxTemp | 0 | 210 | 185 | HIGH-FAIL |
| Max Cool Slope | 1 | 4 | 4 | PASS |
| Max Ramp Slope | 1 | 4 | 2 | HIGH-FAIL |
| Max Temperature | 203 | 213 | 210 | HIGH-FAIL |
| Time Above 183 | 30 | 78 | 80 | HIGH |
| Time Between 140 - 175 | 60 | 93 | 120 | PASS |
| Total Time | 250 | 399 | 600 | PASS |
| Time over 183 | 45 | 78 | 70 | HIGH-FAIL |

Export Date:          8:49:04 AM
Part: U6
Profile: TEST CARD U6
Machine:          Machine 1

| StatName | LCL | Actual | UCL | Status |
|---|---|---|---|---|
| Bottom Time Over 183 | 0 | 0 | 0 | PASS |
| BottomMaxTemp | 0 | 177 | 185 | PASS |
| Max Cool Slope | 1 | 2 | 4 | PASS |
| Max Ramp Slope | 1 | 2 | 2 | PASS |
| Max Temperature | 203 | 205 | 210 | PASS |
| Time Above 183 | 30 | 76 | 80 | PASS |
| Time Between 140 - 175 | 60 | 82 | 120 | PASS |
| Total Time | 250 | 321 | 600 | PASS |
| Time over 183 | 45 | 76 | 70 | HIGH-FAIL |

Export Date:
Part: U6
Profile: TEST CARD U6
Machine:          Machine 1

| StatName | LCL | Actual | UCL | Status |
|---|---|---|---|---|
| Bottom Time Over 183 | 0 | 0 | 0 | PASS |
| BottomMaxTemp | 0 | 171 | 185 | PASS |
| Max Cool Slope | 1 | 2 | 4 | PASS |
| Max Ramp Slope | 1 | 2 | 2 | PASS |
| Max Temperature | 203 | 206 | 210 | PASS |
| Time Above 183 | 30 | 52 | 80 | PASS |
| Time Between 140 - 175 | 60 | 76 | 120 | PASS |
| Total Time | 250 | 291 | 600 | PASS |
| Time over 183 | 45 | 52 | 70 | PASS |

*FIG. 10*

METHODS AND APPARATUS FOR
EFFICIENTLY GENERATING PROFILES FOR
CIRCUIT BOARD WORK/REWORK

CROSS REFERENCE TO RELATED APPLICATIONS

This application is a divisional of U.S. patent application Ser. No. 11/461,551 entitled "METHODS AND APPARATUS FOR EFFICIENTLY GENERATING PROFILES FOR CIRCUIT BOARD WORK/REWORK," filed on Aug. 1, 2006, now U.S. Pat. No. 7,681,776, which is incorporated herein by reference.

BACKGROUND

As is known in the art, printed circuit boards (PCBs) have integrated circuits (ICs) placed on the board. Generally, after populating the PCB with the components, the PCB is tested for proper operation. For example, the PCB may be tested to ensure that all components are operational, are seated properly, and have no fatal soldering defects, such as solder bridges.

In the case where an IC, using mounting technology such as a ball grid array (BGA), must be removed from/added to the board, a particular heating protocol should be followed to effect removal/addition of the BGA without adversely affecting the PCB or neighboring components. More particularly, the solder must be heated based upon the particular characteristics associated with the solder and additionally the unique thermal characteristics of the solder to PCB union. One known machine to rework PCBs ICs is the Onyx 29 rework station by Air-Vac Engineering Company in CT. The Onyx machine, and others like it, require a manual exploration of the various machine parameters (heat rate, time, temperature, pressure and so on) required to effectively solder or unsolder an IC on a particular PCB. This process is functional, however, the Onyx machine lacks statistical process control (SPC) for accuracy and repeatability and requires significant manual operator knowledge and skill to generate a profile for a given IC on a PCB, which requires much time and effort by the operator and other technical personnel. In addition, generation of a profile requires significant trial and error to achieve sufficient control of the machine to effect successful BGA removal/insertion.

SUMMARY

Embodiments of the present invention provide methods and apparatus to efficiently generate profiles to control a system to effect removal/insertion of an integrated circuit (IC) using mounting technology such as for a Ball Grid Array (BGA) component, without affecting neighboring components. Various heat-generating mechanisms are controlled in temperature and time and sometimes pressure and sometimes rate to meet various characteristics of solder or other materials, such as solder heating stages, for successful removal/insertion of the component of interest. With this arrangement, profiles can be modified with system feedback for efficient generation of profiles. While the inventive embodiments are primarily shown and described in conjunction with BGA components, it is understood that the invention is applicable to ICs in general, and in particular, ICs having complex input/output connections underneath the IC.

In one aspect of the invention, a system includes a first module to store times and temperatures for stages in a profile to rework a populated printed circuit board (PCB) for a first integrated circuit (IC) on the PCB, a baseline of sorts, and a second module to store suggestions for modifying the times and/or the temperatures in the profile to generate a revised profile, the suggestions being associated with pass/fail indications determined from actual temperature information for the profile.

In another aspect of the invention the system can be integrated into the original manufacture of the equipment and include automated feedback loops using time/temperature/video sensors to effect even greater efficiency and effectiveness.

In another aspect of the invention the system can build a decision management database of relevant data by automatically or manually collecting SPC data from the operator and/or sensors to effect even greater efficiency and effectiveness by automatically suggesting better control inputs based on historically successful adjustments.

The system can display various information including times and temperatures for the profile stages, actual temperature information collected by the system, and/or pass/fail indications. The system can further include variables associated with the pass/fail suggestions, the variables having an upper and/or lower limit for a time and/or temperature against with the actual temperature information can be compared to determine the pass/fail indication. The suggestions can be associated with one or more fail indications defined by at least one of the variables.

In another aspect of the invention, a method includes receiving times and temperatures for stages of a profile to rework a populated printed circuit board (PCB) for a first integrated circuit (IC), collecting actual temperature information for the PCB for the profile, and generating a suggested modification to the time and/or the temperature of at least one of the stages in the profile in response to a fail status indicating that the collected temperature information did not meet temperatures for a variable.

The method can further include generating instructions to display the profile stage times and temperatures, generating instructions to display the actual temperature information, and generating instructions to display pass/fail indications for the variables. In one embodiment, modification of the profile in accordance with the suggestion for the fail indication removes the failure.

BRIEF DESCRIPTION OF THE DRAWINGS

The foregoing features of this invention, as well as the invention itself, may be more fully understood from the following description of the drawings in which:

FIG. 10 is a textual depiction of profile history information; and

DETAILED DESCRIPTION

Figure 1:
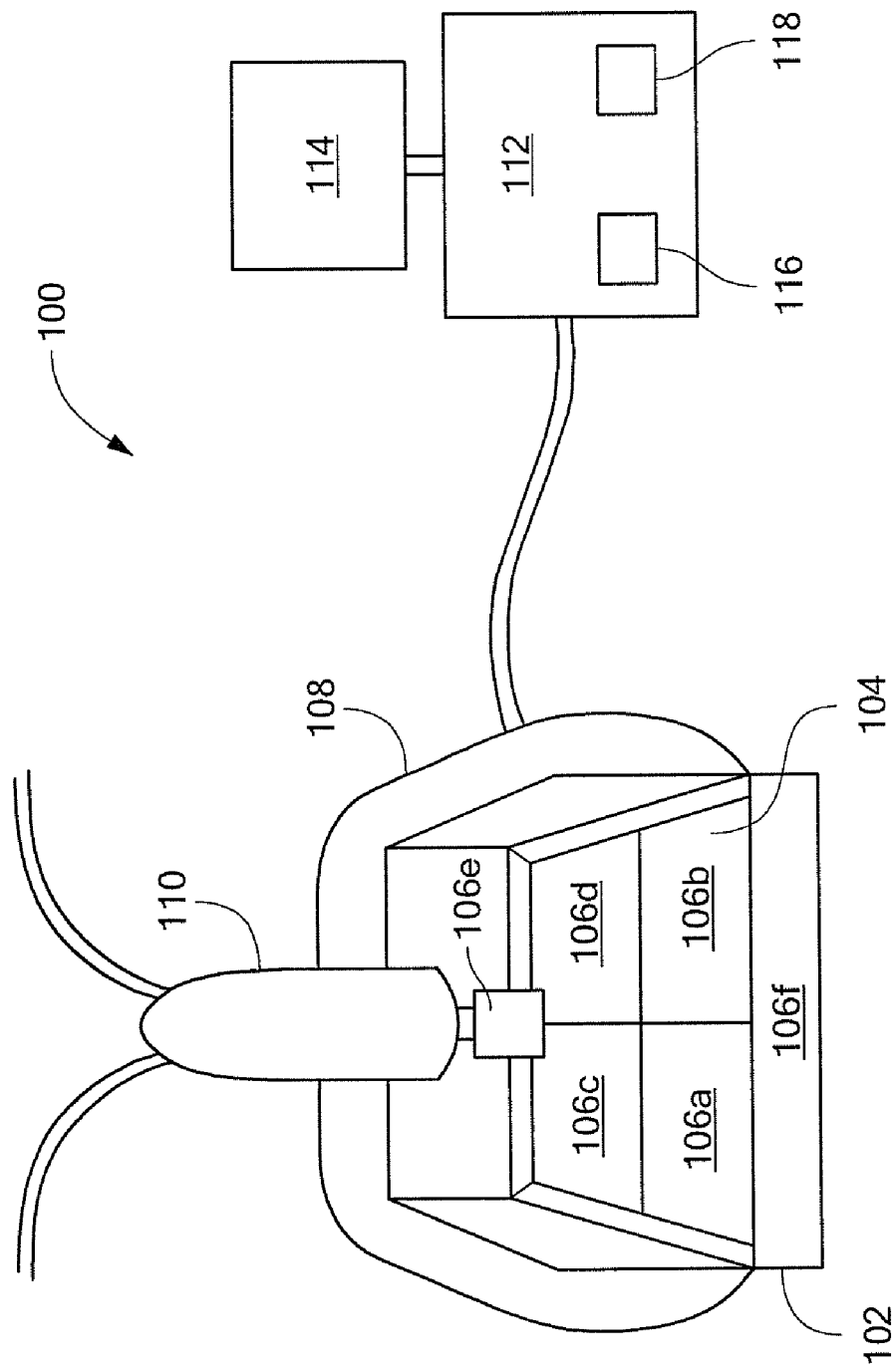
FIG. 1 is a pictorial representation of an exemplary system to generate profiles to work and/or rework circuit boards in accordance with exemplary embodiments of the invention.

FIG. 1 shows an exemplary PCB work/rework machine 100 having feedback for efficient generation of profiles to insert/remove a particular IC, such as a BGA, from a PCB in accordance with the present invention. The machine 100 includes a base 102 having a bed 104 with multiple zones 106a-f to for which temperature and other information can be recorded, as described more fully below. The bed 104 is configured to receive a PCB for rework or other tasks. A frame 108 is secured to the base 102 with a heating device 110 that can be positioned to target heat in a desired location to manipulate solder temperature. The machine 100 further includes a workstation 112 and user interface 114 to enable control of the machine. In an exemplary embodiment, the profiles are stored and/or accessed by the workstation 112. Profile times and/or temperatures can be stored in a first module 116 and profile modification suggestions can be stored in a second module 118.

A similar type of machine and system can be used to lay up composite manufactured parts, PCBs, aircraft components, nanotubes, and other complex pick and place operations requiring fine adjustment to various parameters. Other similar type of machines can be used for the manufacture or candy or other baked items for human consumption, where the variation of various parameters like flow, temperature and time can be more optimally controlled and optimized after an initial run.

Figure 2:
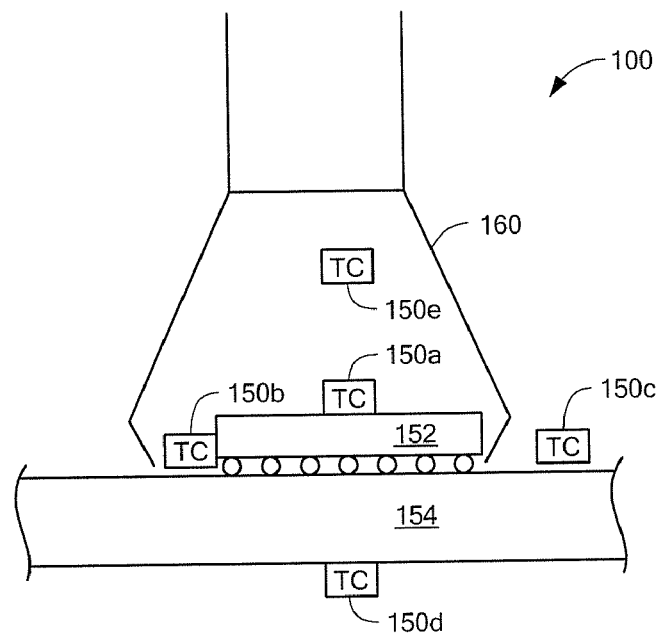
FIG. 2 is a pictorial representation of a portion of the system of FIG. 1.

FIG. 2 shows further details of the machine 100 to collect temperature information from a PCB. The machine includes a series of temperature sensing elements 150a-e, such as thermocouples (TC), to detect temperature information. In one embodiment, a first TC 150a is located to be proximate a top of an IC 152, such as a BGA, to measure the case temperature of the BGA. A second TC 150b is positioned to detect temperature at an interface between the board 154 and the BGA 152, e.g., under the BGA. A third TC 150c is positioned to detect temperature on top of the PCB adjacent to the BGA 152. A fourth TC 150d is located under the PCB 154 in alignment with the BGA to detect temperature under the PCB as the BGA is heated. A fifth TC 150e can be located within the 'oven' that is used to focus heat on the BGA.

An oven element 160 can be placed over the BGA to heat the BGA and solder in a controlled manner. The oven element 160 focuses heat on the BGA 152 of interest and limits the amount of heat transferred to neighboring devices. The oven element 160 can be coupled via hose, for example, to a remote heat source under the control of the workstation 112 (FIG. 1).

The temperature sensing elements 150 collect actual temperature information as profiles are run. Based upon the collected temperature information, adjustments can be made in time and/or temperature of the profile to meet the parameter limitations of solder and/or other material. For example, solder is heated in a series of stages to effect optimal conditions for reflow and clean up when removing a component. Exemplary stages include preheat, soak, ramp, reflow, and cool down.

It is understood that while exemplary embodiments of the invention are primarily shown and described in conjunction with BGA components, it is understood that the invention is applicable to ICs and PCBs in general for which it is desired to generate rework profiles. As is known in the art, BGA packages have particular rework challenges due to the input/output pins being located under the package with a limited ability to focus heat on the solder connecting the I/Os to the board. For example, current BGA packages have 64 pins with 64 solder balls in the space of a 5×5 millimeter square package: about the size of the top of a pencil eraser. Some have more and some have fewer connections in various sizes, such as a 10×10 millimeter square, etc.

Figure 3:
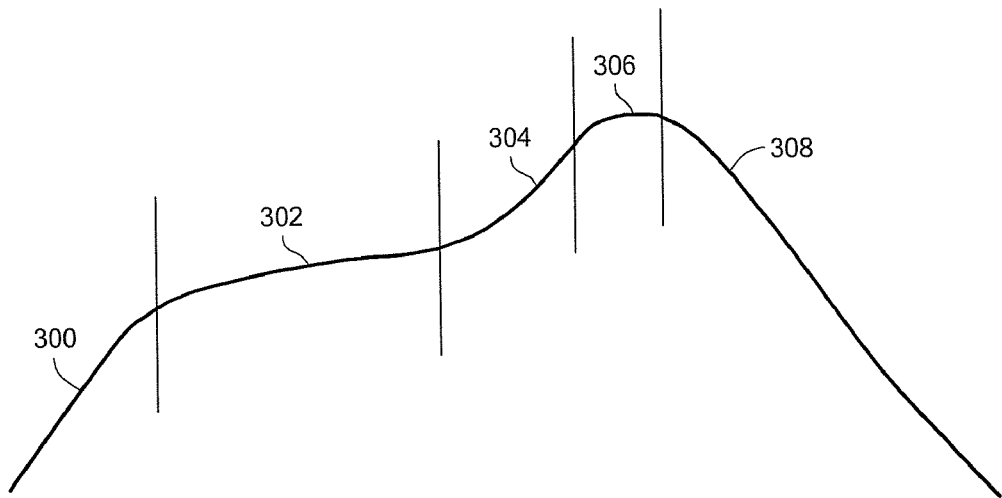
FIG. 3 is a graphical depiction of solder stages that can be used by the system of FIG. 1.

FIG. 3 is a graphical depiction of temperature over time for solder to achieve optimal performance and control of the solder. In the illustrated diagram, solder phases include preheat 300, soak 302, ramp up 304, peak or reflow 306, and cool 308. The temperature, duration, and temperature acceleration/deceleration for each phase can be defined for each solder or other material. As is known in the art, the solder should transition to a liquid phase in a controlled manner to achieve the desired connection between a pad on the PCB and an I/O on the IC. If the solder temperature is not controlled with sufficient precision, the solder can form undesirable geometries resulting for example, in unwanted connections, weak connections unable to support operational current flows, fractures, etc. For removal, the machine works in an even more precise manor to effect a safe removal of the component without damaging the PCB and leaving its surface ready to accept a new or revised component.

For example, a typical 63 millimeter or 135 millimeter thick PCB may be preheated to 80-120 degrees C. prior to a rework. Sometimes the board is not preheated. The range for soldering and desoldering is usually 170 degrees C. to 245 degrees C., with 210-220 degrees C. most frequent. Time at temperature can range from 10 to 75 seconds, with 45 seconds typical.

Figure 4:
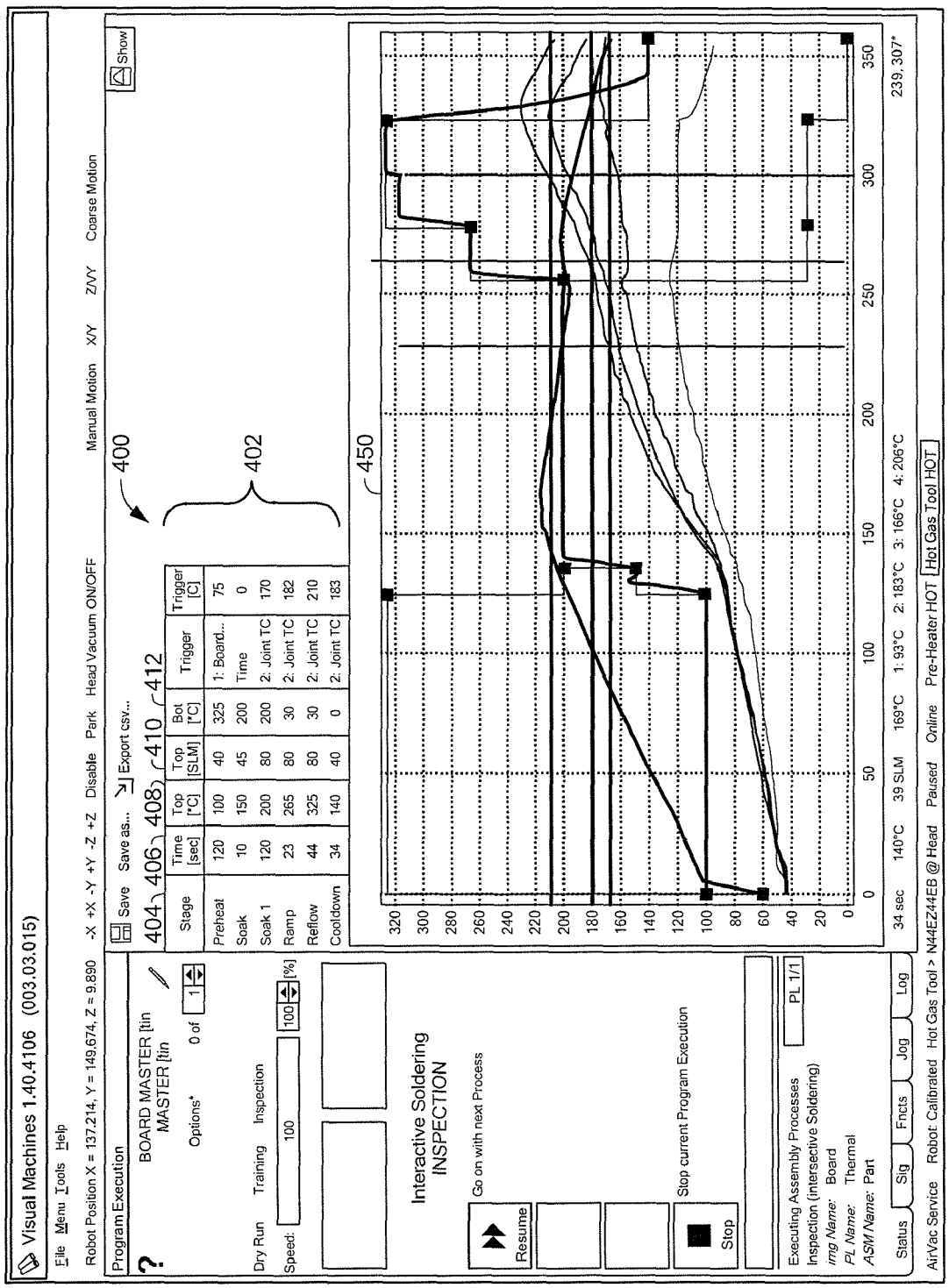
FIG. 4 is a screen display of profile stage time and temperatures and actual temperature information.

FIG. 4 shows an exemplary user interface 400 to rework a particular IC on a given PCB. In general, the characteristics of the PCB will be known. That is, the type and location of each IC on the PCB is known. The solder used for the IC of interest is also known along with its associated temperature profile. In general, a user desires to generate a profile to successfully rework the PCB to remove/insert the IC. Once generated, the profile can be used in a production environment to efficiently rework PCBs for which the IC of interest is to be removed/inserted. In general, the removal process will be similar to the insertion process.

The user interface 400 includes a first region 402 having a stage column 404, a time column 406, a first top column 408 (for top of the IC), a second top column 410 (for top of the PCB), and a bottom column 412. The values in the columns for each row, which lists a particular phase (preheat, sock, etc.) for the solder, indicate times and temperatures to control the machine for treating the IC and PCB to achieve desired actual conditions when removing/inserting a particular IC. In general, the listed values can initially be set based upon past experience for similar ICs and PCBs, as well as the solder profile.

In a second region 450 of the user interface 400, the actual temperature information from the temperatures sensing elements, such as the TCs 150 of FIG. 2, is graphically shown. Graphical actual temperature information is shown and described below.

Figure 5:
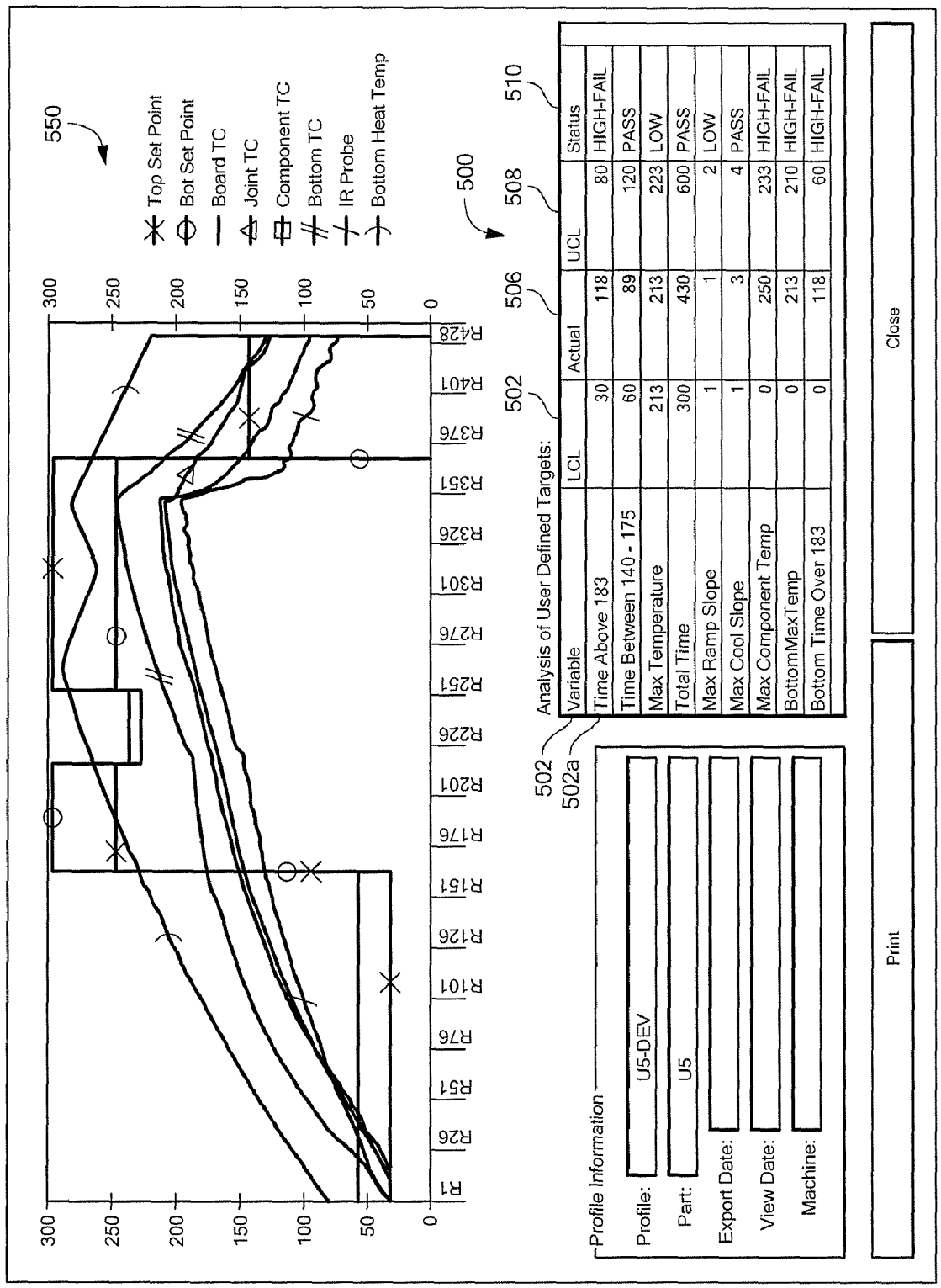
FIG. 5 is a screen display of actual temperature information and temperature analysis for variables.

As shown in FIG. 5, various defined variables having certain criteria for a profile can be examined to determine if the desired temperature characteristics have been met. In the illustrated user interface embodiment, a table 500 includes columns for variable 502, lower limit 504, actual 506, upper limit 508, and pass/fail status 510. Each row provides the information for one of the variables 502a-N. The first variable 502 is "time above 183" with a lower limit 504 of 30 degrees, an actual 506 of 118 degrees, and an upper limit 508 of 80 degrees. Since 118 degrees is above the upper limit of 80 degrees the status 510 for this variable is "high-fail". In addition to a fail indication, the status also includes a "high-fail" indication that the failure is due to exceeding the upper limit. The remaining variables 502 similarly have actual values 506 that are evaluated against lower and upper limits 504, 508 to determine a pass/fail status 510 for the variable.

The temperature data can be represented graphically over time in a further region 550 of the user interface. The thermocouples 150 (FIG. 2) can collect the temperature information over for plotting against set points, such as upper/lower limit.

Figure 6:
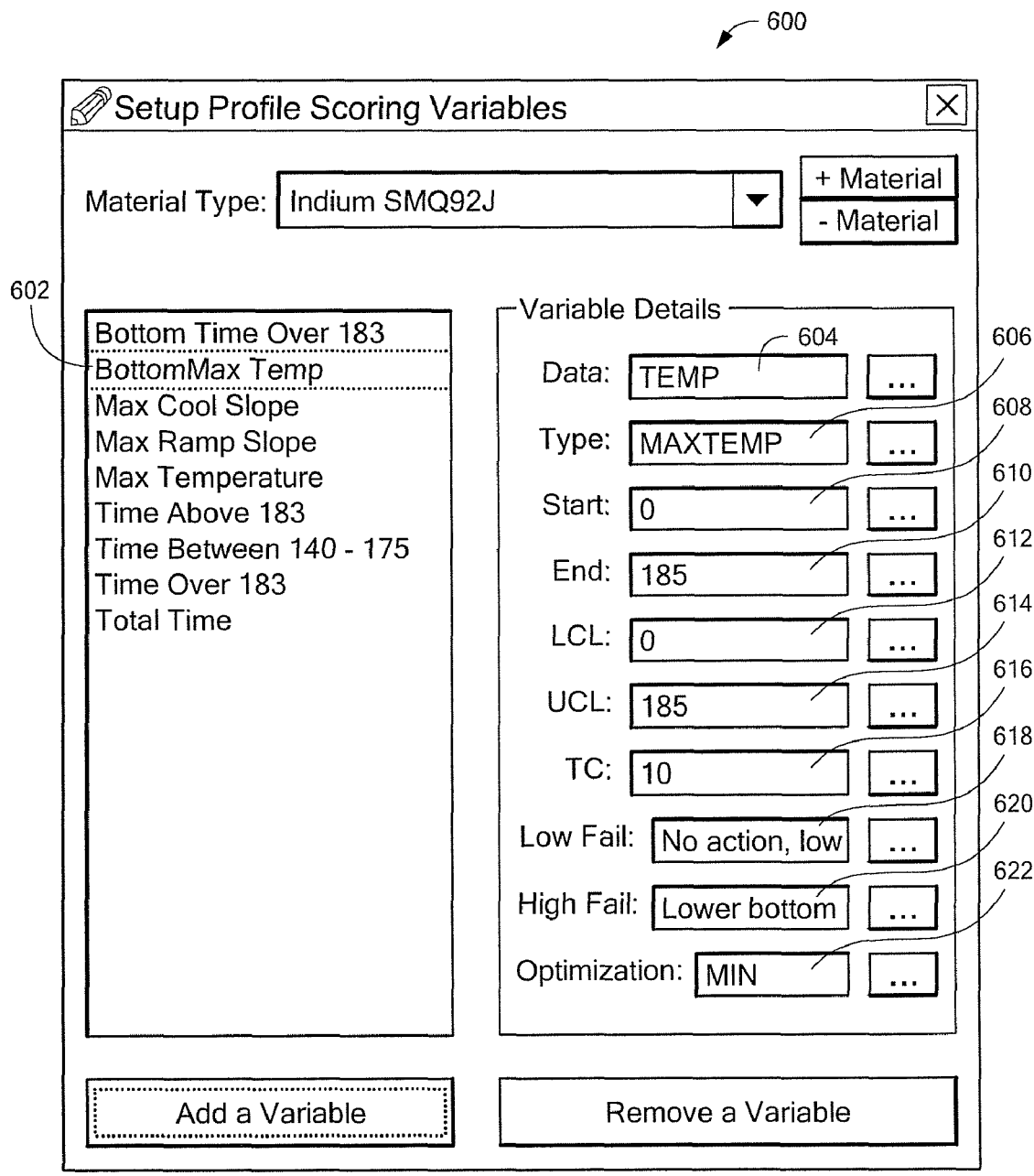
FIG. 6 is a screen display enabling a user to define variables.

FIG. 6 shows an exemplary user interface screen 600 for a material listed as Indium SMQ92J. In the illustrated screen 600, for a given variable various items can be defined. For example, for the variable "bottom max temp" 602 (maximum temperature for the thermocouple at the bottom of the PCB), temperature TEMP data 604 can have a maximum temperature type MAXTEMP 606 defined over a "start" time (t=0) 608 and an end "end" time (t=185 s) 610. A lower limit temperature LCL 612 and an upper limit temperature (UCL) temperature 614 can be defined for a particular thermocouple 616.

In addition, for a "low fail" warning, a suggested course of action can be provided in a text area 618, which can appear, for example, in a dialog box to the user after data collection. Similarly, a "high fail" warning can also be provided in an associated text area 620. The type of optimization, such as center, minimum, or maximum, can be selected in a field 622, as discussed further below.

It is understood that a variety of other time and temperature variables will be readily apparent to one of ordinary skill in the art without departing from the invention.

Figure 7:
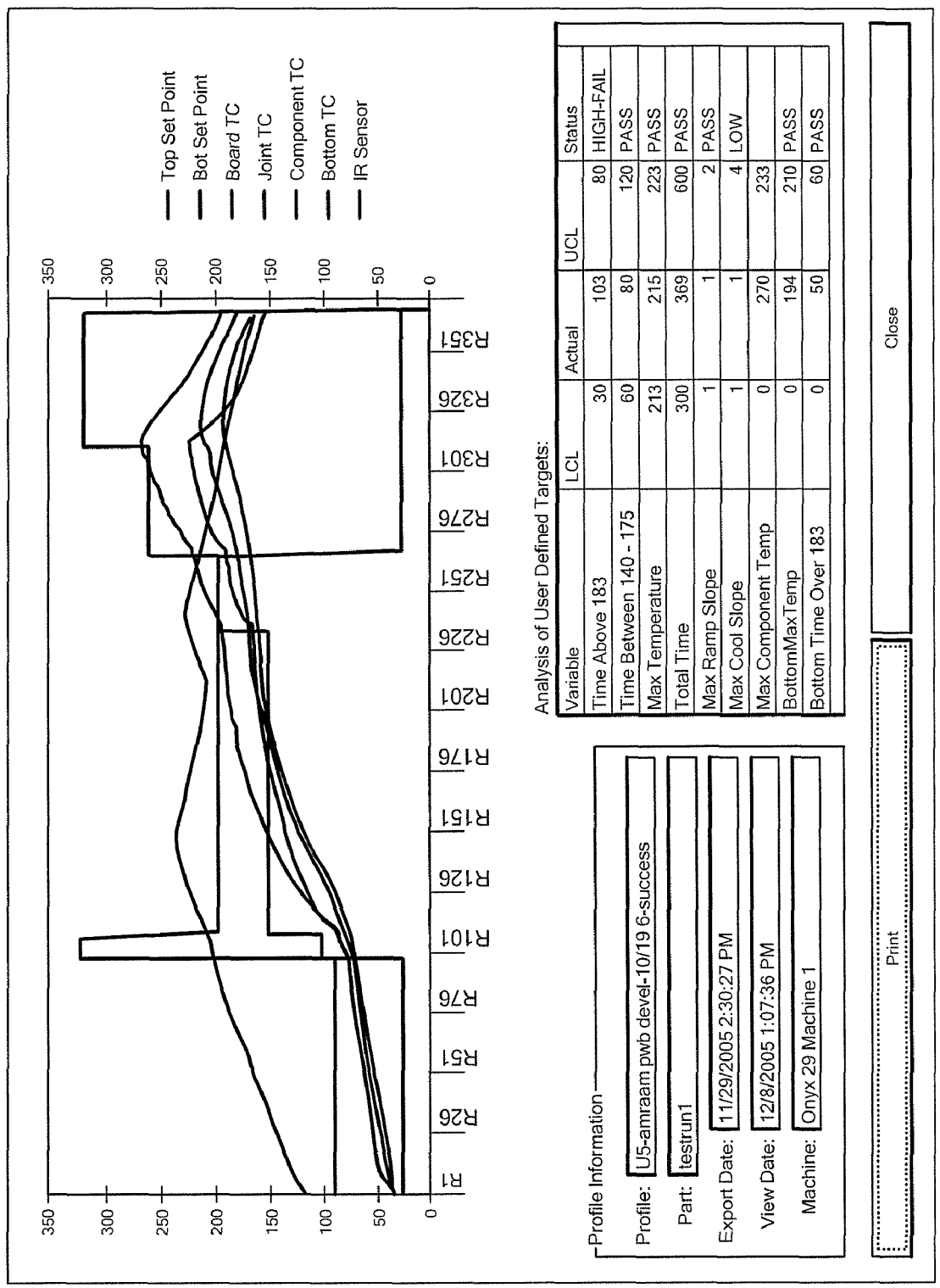
FIG. 7 is a screen display showing actual temperature information and temperature analysis including failure indications.

In exemplary embodiments, the machine provides suggested time/temperature modifications for the profile based upon failure status indications for the defined variables. Based upon the results, such as those shown FIG. 7, the user can adjust the times and/or temperatures for the stages 404 in FIG. 4. For example, where the "time above 183 degrees" variable was indicated as failing high, the user can decrease one or more stage or phase temperatures and/or reduce phase durations.

Figure 8A:
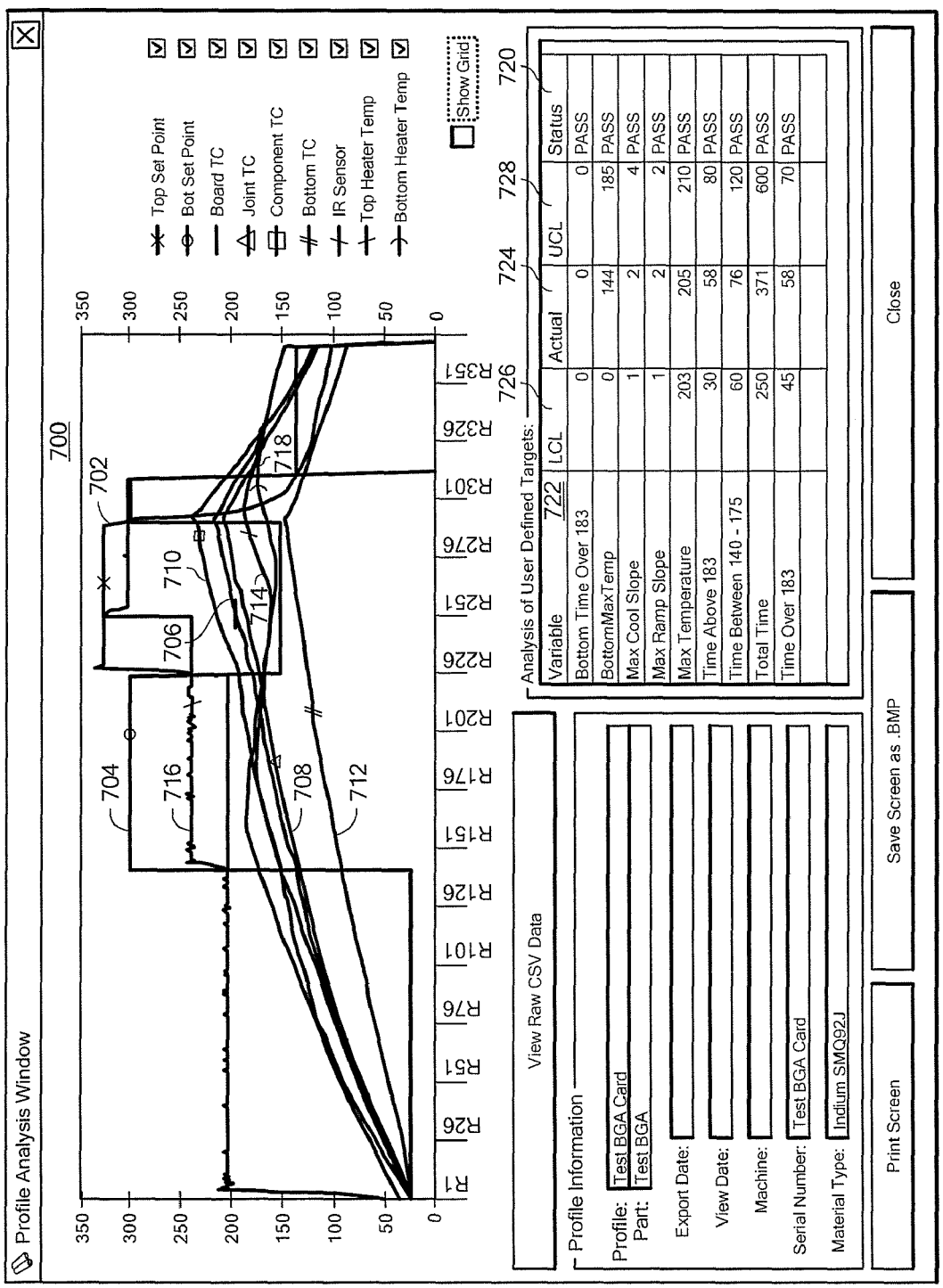
FIG. 8A is a screen display of actual temperature information and temperature analysis with pass indications.

FIG. 8A shows an exemplary profile analysis output screen 700 showing graphical temperature data for a given BGA component on a PCB. Top and bottom set points 702, 704 are shown along with temperature data for thermocouples board TC 706, joint TC 708, component TC 710, and bottom TC 712. Also shown is data for an IR sensor 714, a top heater temperature 716, and a bottom heater temperature 718.

The screen 700 further includes pass/fail status indications 720 for each variable 722 defined for the profile. In the illustrated screen, each pass/fail status indication is pass, as the actual data 724 falls between the LCL and UCL limits 726, 728

Figure 8B:
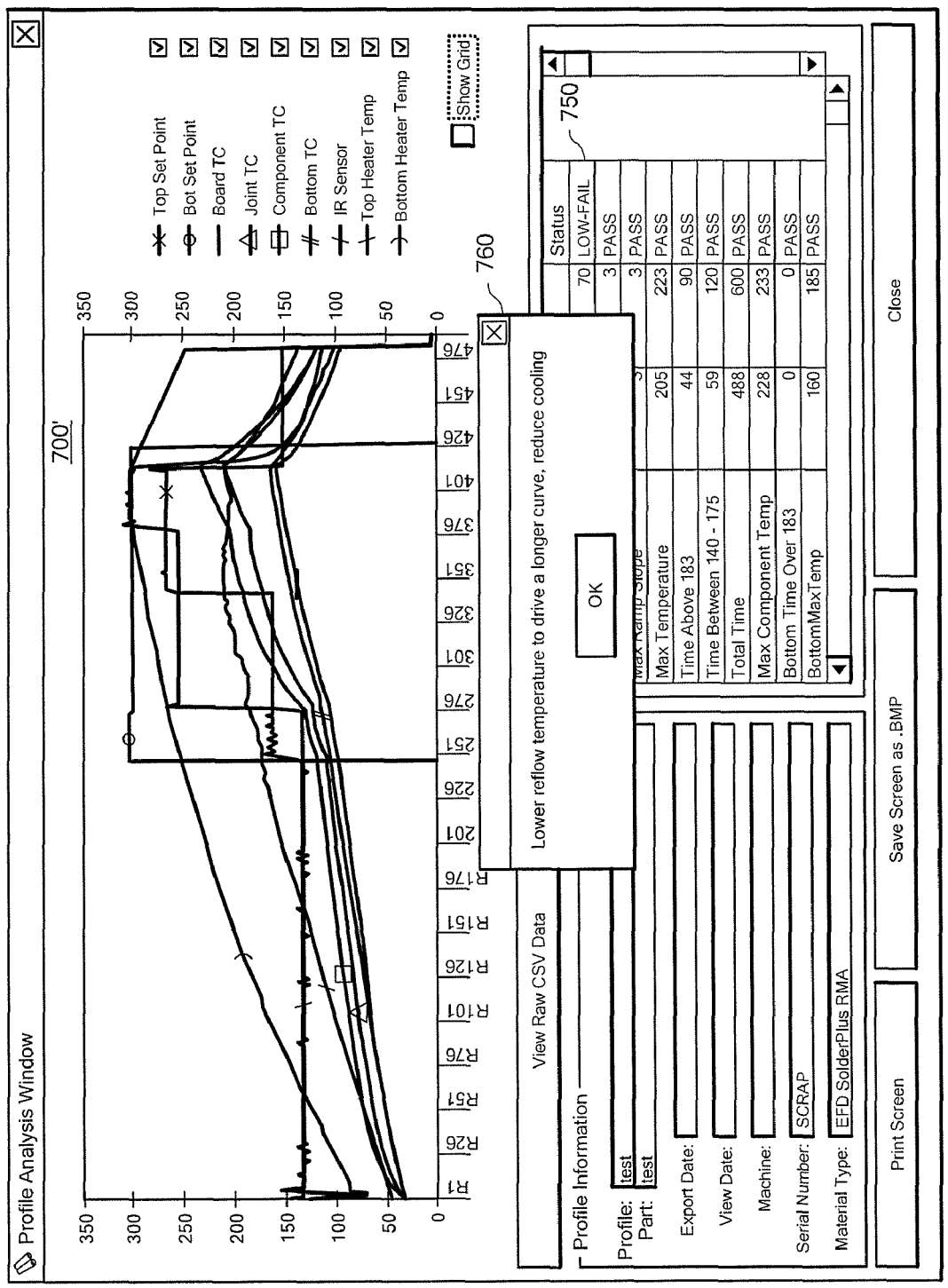
FIG. 8B is a screen display of actual temperature information and temperature analysis with a failure indication and a suggest modification to the profile.

FIG. 8B shows an exemplary profile analysis output screen 700' having similarities with the screen of FIG. 8A and showing a "low-fail" pass/fail status 750. The variable "time Over 183", which can be seen in FIG. 8A, has an LCL of 45 and an UCL of 70. In the run for FIG. 8B, the actual temperature was below the LCL of 45 degrees resulting in the "LOW-FAIL" status indication.

In response to the low failure 750 associated with the variable, the system generates a dialog box 760 suggesting "Lower reflow temperature to drive a longer curve, reduce cooling." The operator can then modify the profile to adjust the reflow temperature, such as by adjusting the reflow stage 404 temperature 406 in FIG. 4 as suggested. In one embodiment, the dialog box 760 information is input by the user, such as in the "low-pass" field 618 shown in FIG. 6 when the variable is defined.

A wide variety of information can be provided in the dialog boxes in response to the collected temperature information. Exemplary suggestions can include lowering or raising temperatures for lesser or greater periods of time in one or more of the various phases. Further suggestions can relate to pressure and/or other parameters.

In one particular embodiment, responses to temperature data depend on the optimization type that is selected (e.g., Minimize, Center, Maximize), such as in the optimization field 622 of the variable definition of FIG. 6. In the illustrated embodiment, there are five possible responses: Low, Low-Fail, Pass, High, High Fail. The responses can be color coded to enhance the user experience, such as Red, Yellow, Green, Yellow, and Red, respectively.

In an exemplary embodiment, the upper limit UCL and lower limit LCL alert limits are set to +/−5%. So for example:
If the UCL was 20 degrees the UCL warning (High) would be 19 degrees (20−(20*0.05)) a High-Fail would occur for any number over 20;
If the LCL was 10 degrees the LCL warning (Low) would be 10.5 degrees (10+(10*0.05)) a Low-Fail would occur for any number under 10.

Figure 9:
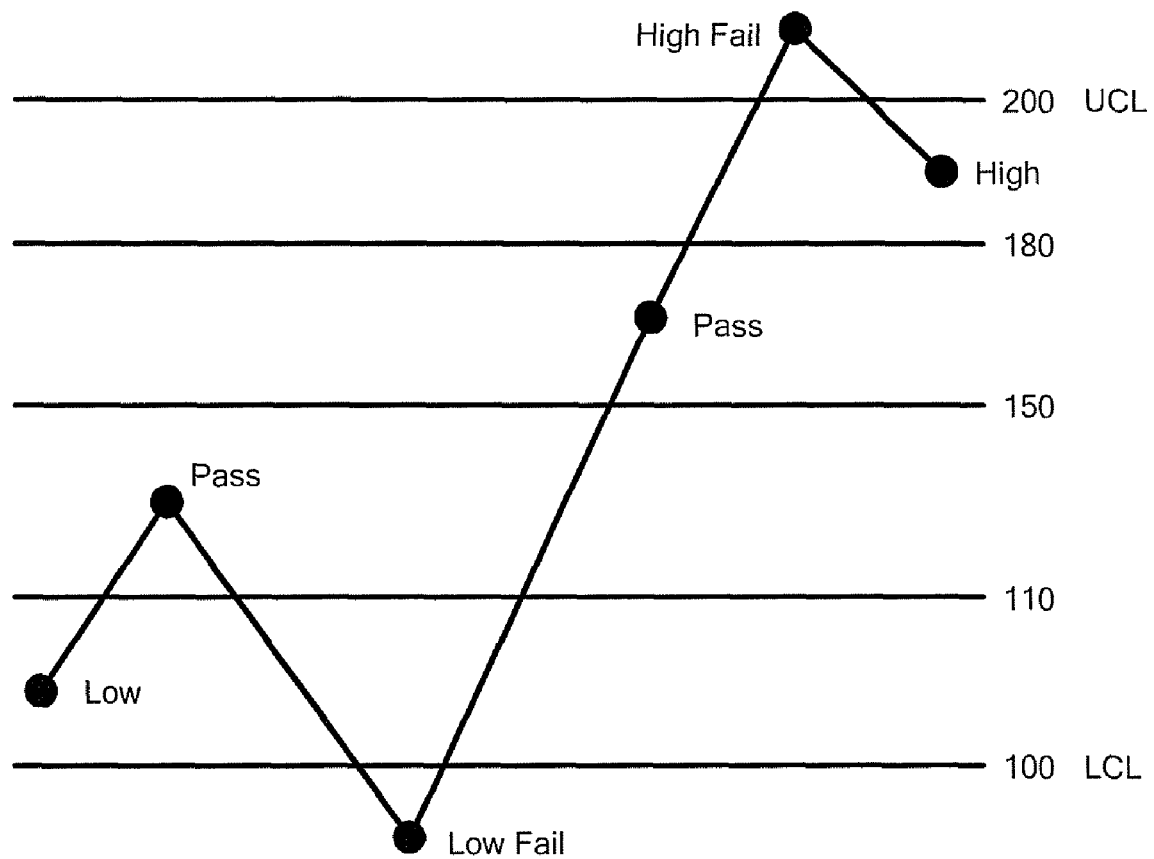
FIG. 9 is a graphical depiction of temperature information and lower and upper limits and warnings.

Illustrative guidelines are set forth below:

Maximize:
Low Fail and Low are scored as in the above example
High is ignored since the goal is to maximize the variable without going over the UCL
High Fail will occur if the variable goes over the UCL
Pass will be returned for any value that is greater than the LCL+5% and lower than the UCL Minimize:
Low is ignored since the goal is to minimize the variable without dropping below the LCL
High and High fail are scored as in the above example
Pass will be returned for any value that is less than the UCL−5% and above the LCL Center:
Low-Fail will return for any value below the LCL
Low will return for any value between LCL+5% and the LCL value
Pass will return for any value between LCL+5% and UCL−5%
High will return for any value between UCL−5% and the UCL value
High-Fail will return for any value above the UCL FIG. 9 shows an exemplary chart of temperature data points and how rules are applied to the data points depending upon where they fell in the control limits. The illustrated example is based on a centered optimization with a LCL of 100 and a UCL of 200 with 10% warning zones. The expected mean is 150 degrees.

The upper warning area is between 180 and 200 as 200−(0.1*200)=180. Similarly, the lower warning areas is from 100 to 110 degrees. Above 200 degrees is a high-fail and below 100 degrees is a low fail. Between 110 and 180 degrees is a pass.

FIG. 10 shows an exemplary textual chronological history report 800 for a given part for which a profile is to be generated. As can be seen, the number of failure status indications decreases as the profile parameters are adjusted so that the actual data meets the variable settings.

Figure 11:
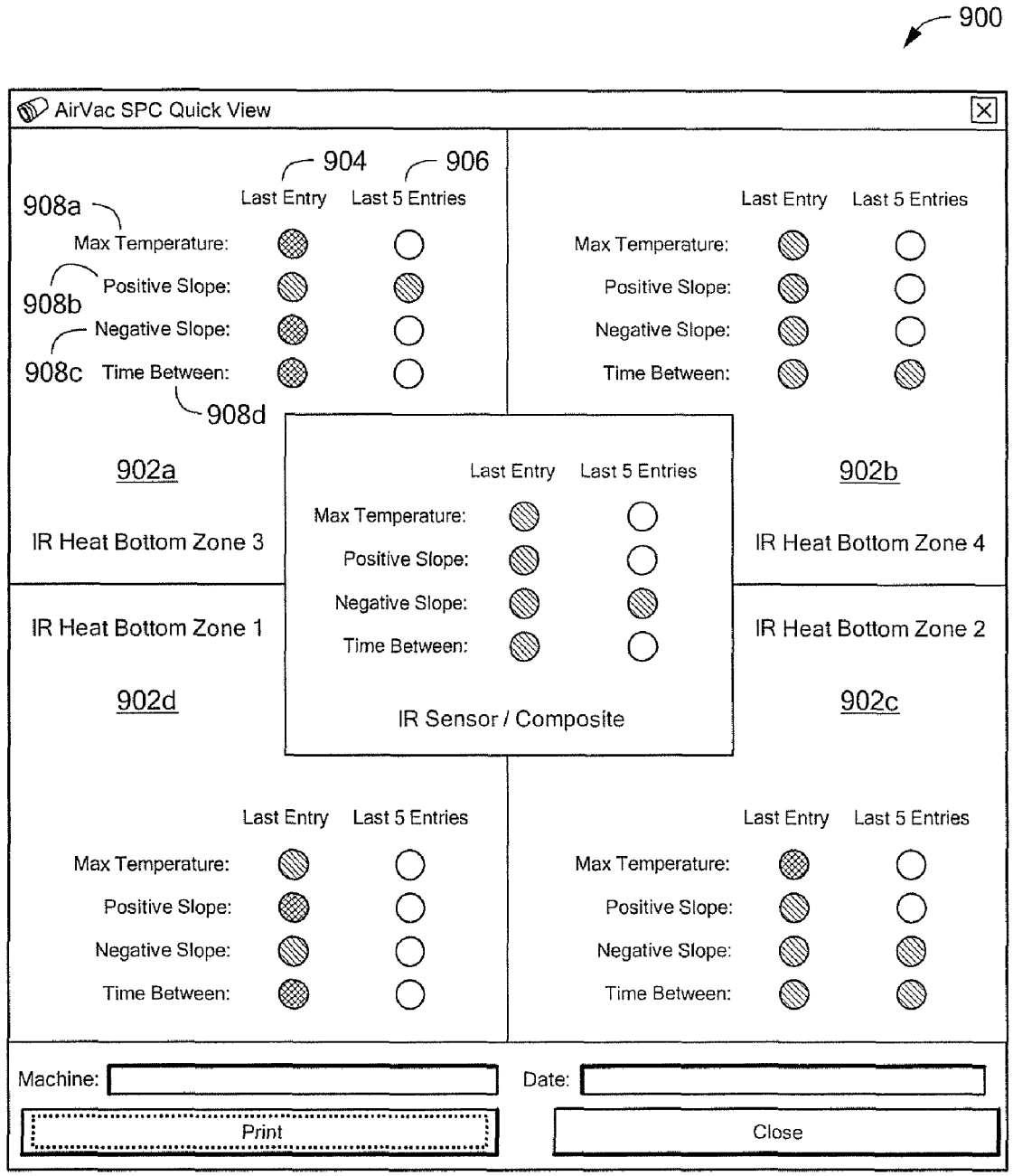
FIG. 11 is a screen display of statistical process control information.

In another aspect of the invention, statistical process control (SPC) information can be collected to ensure proper operation of the system, such as the oven mechanism and thermocouples. FIG. 11 shows an exemplary screen 900 that can provide SPC information to the user. In one embodiment, a known component, such as a so-called Durastone board can be profiled at known times to detect nonconforming conditions, such as a faulty oven component that provides inadequate levels of heat. The heating zones 902a-d can be monitored for the last entry 904 and the last five entries 906, for example. Various parameters can be monitored, such as maximum temperature 908a, positive slope 908b, negative slope 908c, and time 908d, as in the illustrated embodiment. Heat can be monitored using traditional thermocouples or non-contact IR Temperature sensing. Likewise active artificial intelligence and/or a closed loop optimization system can be added to the invention for more efficient automated processing. These type of automated system improvements are particularly suited to the SPC aspect of this invention.

While the inventive embodiments are shown and described in conjunction with a user manually modifying a profile in response to a displayed suggestion after a fail indication, other embodiments are contemplated in which the profile is automatically modified.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
receiving times and temperatures for stages of a profile including solder heating stages to rework a populated printed circuit board (PCB), the rework including removing a first integrated circuit (IC) from the PCB;
focusing heat on the first integrated circuit using an oven element during rework of the PCB;
collecting actual and/or projected temperature information for the PCB for the profile, including collecting actual temperature information from a plurality of temperature sensing elements to detect actual temperature information associated with the first integrated circuit; and
generating a suggested modification for an operator to modify the time and/or the temperature of at least one of the stages in the profile in response to a fail status indicating that the collected actual temperature information did not meet temperatures for a variable.

2. The method according to claim 1, further including generating instructions to display the profile stage times and temperatures.

3. The method according to claim 2, further including generating instructions to display the actual temperature information.

4. The method according to claim 3, further including generating instructions to display pass/fail indications for the variables.

5. The method according to claim 1, wherein modification of the profile in accordance with the suggestion for the fail indication removes the failure.

6. The method according to claim 1, further including collecting statistical process control information.

7. The method according to claim 1, further including optimizing and refining the profile using previously collected statistical process control information.

8. The method according to claim 1, further including generating instructions to display profile historical information.

9. The method according to claim 1, further including building a decision management database of relevant data by automatically and/or manually collecting SPC data from the operator and/or sensors for improving efficiency and effectiveness by automatically suggesting control inputs based on historically successful adjustments.

10. The method according to claim 1, further including employing closed loop feedback control for rework optimization.

11. The method according to claim 10, further including covering the first integrated circuit with the oven element during the rework of the PCB to focus heat on the first integrated circuit.

12. The method according to claim 10, wherein the oven element limits heat applied to neighboring integrated circuits on the PCB.

13. The method according to claim 10, wherein the suggested modification includes one or more of time, temperature, pressure, and location.

14. An article, comprising:
a storage medium having stored thereon instructions that when executed by a machine result in the following:
receiving times and temperatures for stages of a profile including solder heating stages to rework a populated printed circuit board (PCB), the rework including removing a first integrated circuit (IC) from the PCB;
focusing heat on the first integrated circuit using an oven element during rework of the PCB;
collecting actual and/or projected temperature information for the PCB for the profile, including collecting actual temperature information from a plurality of temperature sensing elements to detect actual temperature information associated with the first integrated circuit; and
generating a suggested modification for an operator to modify the time and/or the temperature of at least one of the stages in the profile in response to a fail status indicating that the collected actual temperature information did not meet temperatures for a variable.

15. The article according to claim 14, further including instructions to display the profile stage times and temperatures.

16. The article according to claim 14, further including instructions to display the actual temperature information.

17. The article according to claim 14, further including instructions to display pass/fail indications for the variables.

18. The article according to claim 14, wherein modification of the profile in accordance with the suggestion for the fail indication removes the failure.

* * * * *